United States Patent [19]
Ogawa

[11] Patent Number: 5,585,662
[45] Date of Patent: Dec. 17, 1996

[54] SEMICONDUCTOR INTEGRATED CIRCUIT DEVICE WITH BREAKABLE FUSE ELEMENT COVERED WITH EXACTLY CONTROLLED INSULATING FILM

[75] Inventor: Hisao Ogawa, Tokyo, Japan

[73] Assignee: NEC Corporation, Tokyo, Japan

[21] Appl. No.: 263,420

[22] Filed: Jun. 21, 1994

Related U.S. Application Data

[63] Continuation of Ser. No. 16,896, Feb. 12, 1993, abandoned.

[30] Foreign Application Priority Data

Feb. 24, 1992 [JP] Japan .................................. 4-036556

[51] Int. Cl.⁶ .................................................. H01L 29/00
[52] U.S. Cl. ........................ 257/529; 257/635; 437/922
[58] Field of Search .................................. 257/529, 635; 437/922

[56] References Cited

U.S. PATENT DOCUMENTS

| | | | |
|---|---|---|---|
| 4,217,570 | 8/1980 | Holmes | 257/529 |
| 4,413,272 | 11/1983 | Mochizuki et al. | 257/529 |
| 4,455,194 | 6/1984 | Yabu et al. | 257/529 |
| 4,476,375 | 10/1984 | Ogawa | 257/529 |
| 4,536,949 | 8/1985 | Takayama et al. | 257/529 |
| 5,235,205 | 8/1993 | Lippitt, III | 257/529 |
| 5,329,152 | 7/1994 | Janai et al. | 257/529 |

FOREIGN PATENT DOCUMENTS

| | | | |
|---|---|---|---|
| 60-84838 | 5/1985 | Japan | 257/529 |

OTHER PUBLICATIONS

Full English Translation of Japan Kokai 60–84838 as per USPTO.

S. M. Sze, Semiconductor Devices Physics and Technology, John Wiley & Sons, New York (1985) p. 455.

*Primary Examiner*—J. Carroll
*Attorney, Agent, or Firm*—Burns, Doane, Swecker & Mathis, LLP

[57] ABSTRACT

A breakable fuse element is incorporated in a semiconductor integrated circuit device, and is overlain by a multi-level insulating film structure having the lowest insulating film covering the breakable fuse element and a multi-level insulating sub-structure over the lowest insulating film, wherein an etching stopper is inserted between the lowest insulating film and the multi-level insulating film sub-structure so that an etching for a laser hole is exactly terminated at the etching stopper, thereby exactly controlling the remaining thickness over the breakable fuse element.

6 Claims, 3 Drawing Sheets

SEMICONDUCTOR INTEGRATED CIRCUIT DEVICE WITH BREAKABLE FUSE ELEMENT COVERED WITH EXACTLY CONTROLLED INSULATING FILM

This application is a continuation of application Ser. No. 08/016,896, filed Feb. 12, 1993, abandoned.

FIELD OF THE INVENTION

This invention relates to a semiconductor integrated circuit device and, more particularly, to a semiconductor integrated circuit device having a breakable fuse element.

DESCRIPTION OF THE RELATED ART

A breakable fuse element is incorporated in various semiconductor integrated circuit devices such as, for example, a programming circuit of a semiconductor memory device, and a typical fabrication process is hereinbelow described with reference to FIGS. 1 and 2. The process starts with preparation of a silicon substrate 1, and a silicon dioxide film 2 is grown on the major surface of the silicon substrate 1 to thickness of 0.8 micron. Polysilicon is deposited over the entire surface of the silicon dioxide film 2, and the polysilicon film is patterned to a polysilicon strip 3 through a lithographic process. Phosphorus is doped into the polysilicon strip 3, and the polysilicon strip 3 serves as a breakable fuse element. As will be better seen from FIG. 1, the polysilicon strip 3 has relatively wide contact portions 3a and 3b and a relatively narrow breakable portion 3c extending between the relatively wide contact portions 3a and 3b.

Subsequently, silicon oxide or boron phospho-silicate glass is deposited over the entire surface of the structure to thickness of 1.0 micron by using a chemical vapor deposition, and the silicon dioxide film or the boro phospho-silicate glass film serves as an inter-level insulating film 4.

Contact holes 5a and 5b are formed in the inter-level insulating film 4 over the contact portions 3a and 3b through the lithographic process, and aluminum is deposited over the entire surface of the structure. The aluminum film is patterned into wiring strips 6a and 6b, and the aluminum wiring strips 6a and 6b are held in contact with the contact portions 3a and 3b of the breakable fuse element 3. The aluminum wiring strips 6a and 6b provide conductive paths to an associated component circuit.

Silicon dioxide or phospho-silicate glass is deposited over the entire surface of the structure to thickness of 1.0 micron, and the silicon dioxide film or the phospho-silicate glass film serves as a passivation film 7.

A recess 8 is formed in the passivation film 7 and the inter-level insulating film 4 over the relatively narrow breakable portion 3c through the lithographic process, and the etching stage is controlled so that the remaining thickness t1 is regulated to 0.9 micron.

Upon completion, the semiconductor device proceeds to a programming stage, and a programmer selectively radiates $CO_2$ laser through the recess onto the fuse element, and the fuse element 3 is broken for memorizing a data bit.

However, the remaining thickness t1 of commercial products ranges from 0.5 micron to 1.3 microns, and it is preferable for the remaining thickness t1 to fall into the range between 0.6 micron and 1.0 micron. If the remaining thickness t1 exceeds 1.3 micron, the $CO_2$ laser loses the energy while passing through the inter-level insulating film 4, and the breakable portion 3c is liable to be left between the contact portions 3a and 3b.

On the other hand, if the remaining thickness t1 is less than 0.5 micron, the $CO_2$ laser tends to damage the silicon dioxide film 2 and the silicon substrate 1, and undesirable short-circuit takes place through the silicon dioxide film 2. Moreover, if the breakable fuse element is not broken, water vapor is liable to penetrate the extremely thin remaining thickness t1, and damages the wirings. As a result, the reliability of the fuse element is deteriorated.

Thus, it is important to exactly control the remaining thickness t1. However, if the breakable fuse element is formed under a multi-level insulating film structure, the remaining thickness t1 tends to be dispersed, and the above mentioned problems becomes serious. In detail, a breakable fuse element 3 is assumed to be overlain by a three-level insulating film structure consisting of a first inter-level insulating film of 1.0 micron, a second inter-level insulating film of 0.8 micron, a third inter-level insulating film of 0.8 micron and a surface passivation film of 1.0 micron, and each insulating film is dispersed within 10 per cent. The total thickness of the three-level insulating film structure ranges from (3.6−0.36) microns to (3.6+0.36) microns. While forming the recess 8, the etching speed is assumed to be (80±4) nanometers per minute, and the standard etching stage consumes (3.6−0.9)/0.08=33.8 minutes until the remaining thickness t1 reaches 0.9 micron. However, if the total thickness is maximized and the etching speed is minimized, the standard etching stage results in the remaining thickness t1 calculated as {(3.6+0.36)−(0.08 −0.004)×33.8}=1.39 microns. On the other hand, if the total thickness is minimized and the etching speed is maximized, the standard etching stage results in the remaining thickness t1 calculated as {(3.6−0.36)−(0.08 +0.004)×33.8}=0.40 micron. Therefore, the prior art process can not regulate the remaining thickness within the acceptable range between 0.5 micron to 1.3 microns, and the program error deteriorates the production yield of the semiconductor device is low.

SUMMARY OF THE INVENTION

It is therefore an important object of the present invention to provide a semiconductor device which has a fuse element covered with an exactly controlled transparent insulating film.

To accomplish the object, the present invention proposes to cover an insulating film on a breakable fuse element with an etching stopper.

In accordance with one aspect of the present invention, there is provided a semiconductor device fabricated on a semiconductor substrate, comprising: a) a first insulating film over a major surface of the semiconductor substrate; b) a breakable fuse element formed on the first insulating film; c) a multi-level insulating film structure covering the breakable fuse element, and having c-1) a second insulating film covering the breakable fuse element, and c-2) a multi-level insulating sub-structure covering the second insulating film and having a hole passing therethrough; d) wiring strips formed in the multi-level insulating sub-structure, and held in contact with both end portions of the breakable fuse element; and e) an etching stopper provided on the second insulating film, and exposed to the hole, the etching stopper being formed of a substance resistive against an etchant used for forming the hole.

In accordance with another aspect of the present invention, there is provided a semiconductor device fabricated on a semiconductor substrate, comprising: a) a first insulating film over a major surface of the semiconductor substrate; b) a breakable fuse element formed on the first insulating film; c) a multi-level insulating film structure covering the breakable fuse element, and having c-1) a second insulating film covering the breakable fuse element, and c-2) a multi-level insulating sub-structure covering the second insulating film and having a recess over the breakable fuse element; d) wiring strips formed in the multi-level insulating sub-structure, and held in contact with both end portions of the breakable fuse element; and e) an etching stopper provided on the second insulating film, and located beneath the recess, the etching stopper being formed of a substance resistive against an etchant used for forming the recess.

BRIEF DESCRIPTION OF THE DRAWINGS

The features and advantages of the semiconductor integrated circuit device according to the present invention will be more clearly understood from the following description taken in conjunction with the accompanying drawings in which.

DESCRIPTION OF THE PREFERRED EMBODIMENT

Figure 1:
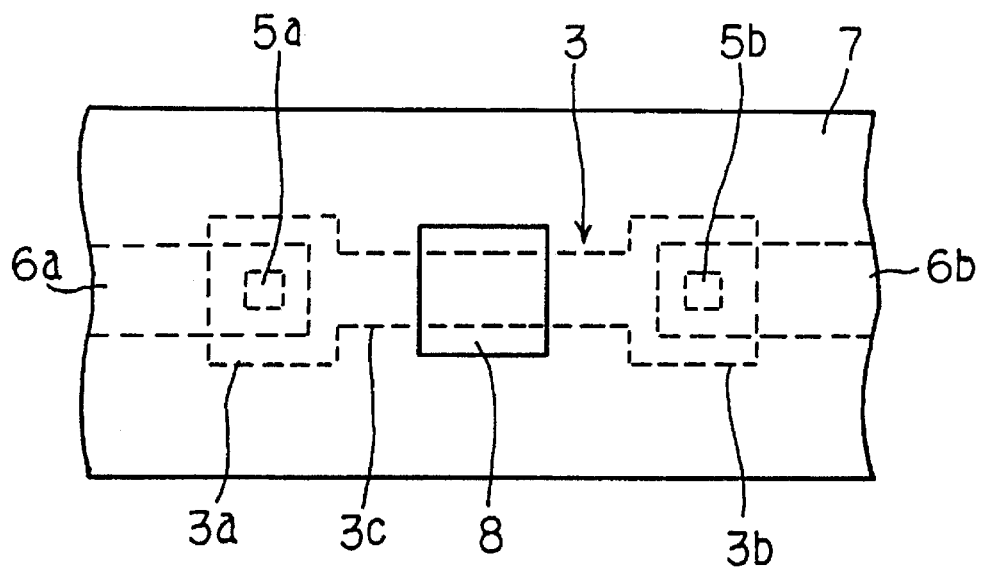
FIG. 1 is a plane view showing the prior art breakable fuse element.
Figure 2:
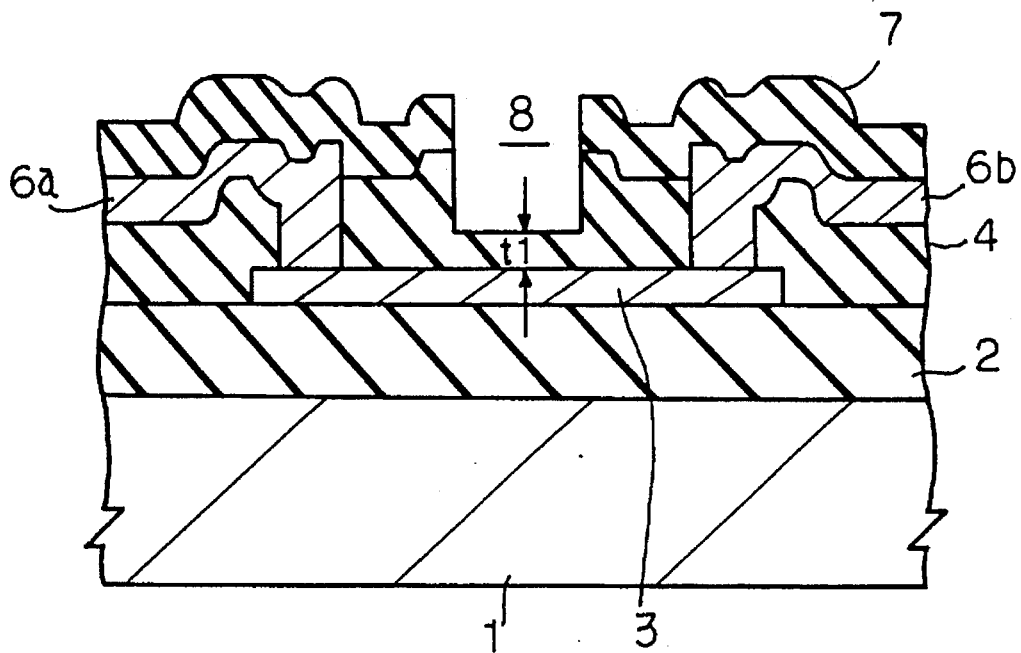
FIG. 2 is a cross sectional view showing the structure of the prior art breakable fuse element.
Figure 3:
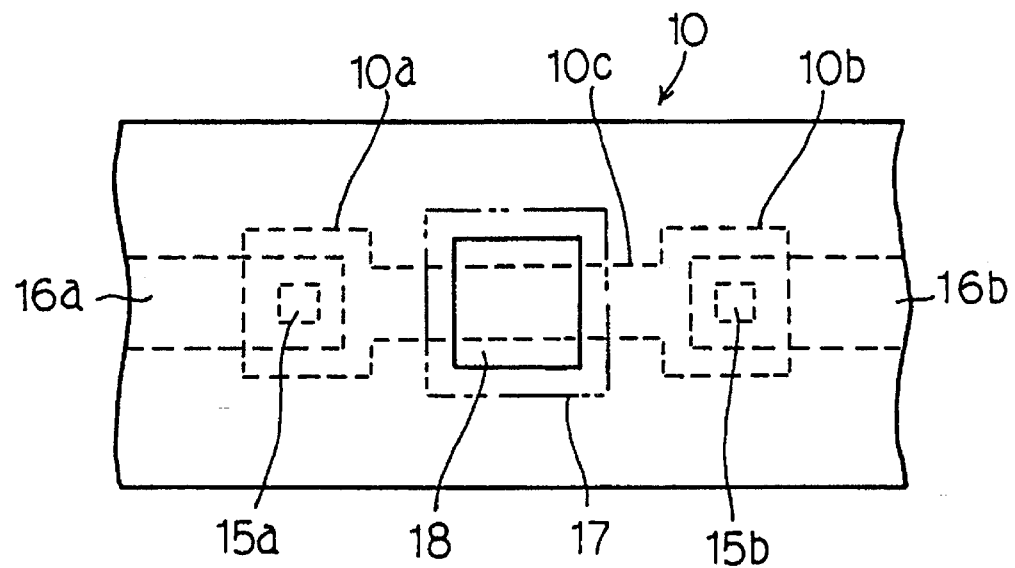
FIG. 3 is a plane view showing a fuse element incorporated in a semiconductor device according to the present invention.
Figure 4:
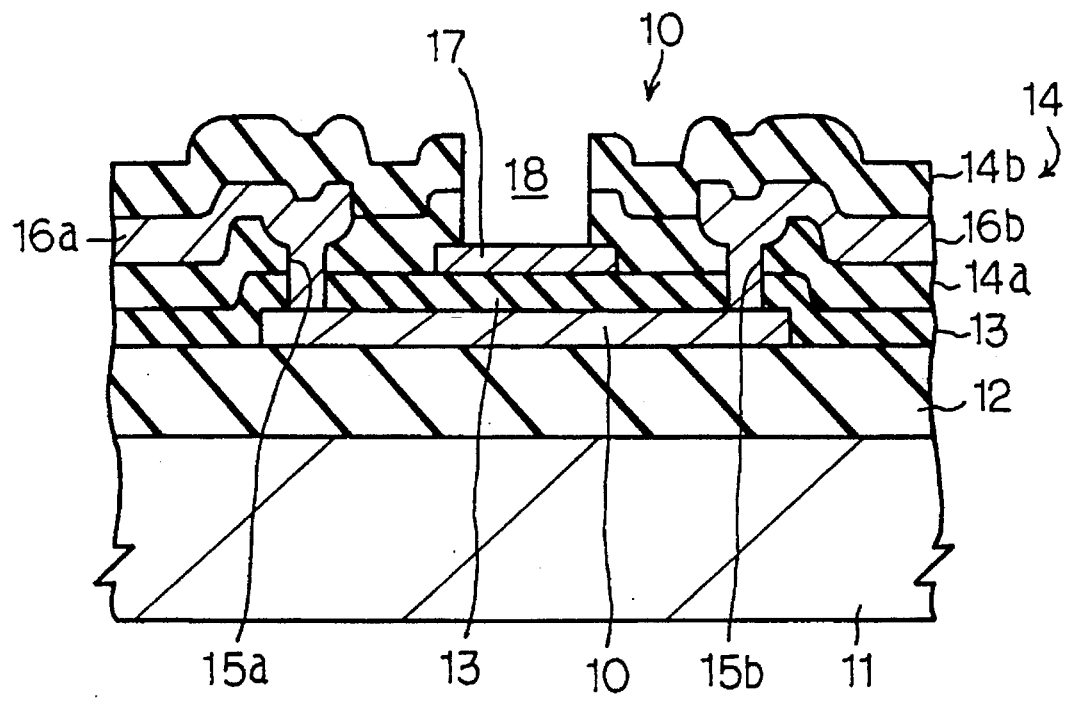
FIG. 4 is a cross sectional view showing the structure of the fuse element shown in FIG. 3.

Referring to FIGS. 3 and 4 of the drawings, a breakable fuse element 10 is fabricated on a silicon substrate 11, and is incorporated in a semiconductor integrated circuit device together with other circuit components (not shown). The semiconductor integrated circuit device may be a semiconductor memory device, and the breakable fuse element 10 forms a part of a program circuit of a redundant unit of the semiconductor memory device.

The fuse element 10 is patterned on a first insulating film 12 over a major surface of the silicon substrate 11, and is covered with a multi-level insulating film structure. The multi-level insulating film structure has the lowest or second insulating film 13 covering the breakable fuse element 10, and a multi-level insulating sub-structure 14 over the lowest insulating film 13. The multi-level insulating sub-structure 14 is fabricated from a third insulating film 14a and a fourth insulating film 14b, and contact holes 15a and 15b are formed through the second and third insulating films 13 and 14a. Wiring strips 16a and 16b extend on the third insulating film 14a, and are held in contact through the contact holes 15a and 15b with both end portions 10a and 10b of the breakable fuse element 10. Both end portions 10a and 10b are relatively wide, and a relatively narrow breakable portion 10c is integral with both end portions 10a and 10b. An etching stopper 17 is inserted between the second insulating film 13 and the third insulating film 14a, and is exposed to a hole 18 formed in the multi-level insulating sub-structure 14.

The semiconductor integrated circuit device thus arranged is fabricated through a process sequence described hereinbelow. The process sequence starts with preparation of the silicon substrate 11, and the major surface of the silicon substrate 11 is thermally oxidized in hydrogen-oxygen containing atmosphere at 980 degrees in centigrade so that the first insulating film 12 of silicon dioxide is grown to thickness of 0.8 micron. The first insulating film 12 thus thermally grown electrically isolates circuits components of the integrated circuit device such as, for example, component transistors and resistors from one another.

Subsequently, polysilicon is deposited over the entire surface of the structure for forming a polysilicon film. Though not shown in the drawings, a thin silicon oxide film is selectively grown on exposed area of the silicon substrate 11 before the deposition of the polysilicon film, and the polysilicon film is patterned into the breakable fuse element 10 and into gate electrodes of the component transistors. Phosphorus is doped into the polysilicon film, and the resistivity is regulated to 15 ohms/square to 30 ohms/square. The breakable fuse element 10 may be formed of a refractory metal such as tungsten or molybdenum, or may have a laminated structure of a phosphorus doped polysilicon film of 0.2 micron thick and a refractory metal silicide film of 0.2 micron thick.

Subsequently, silicon dioxide is deposited through a chemical vapor deposition to thickness of 0.4 micron, and the second insulating film 13 covers the first insulating film 12 and the breakable fuse element 10.

Polysilicon is deposited to thickness of 0.2 micron over the entire surface of the structure, and the second insulating film 13 is overlain by the polysilicon film. The polysilicon film is patterned through a lithographic process, and the etching stopper 17 is provided on the second insulating film 13 over the breakable fuse element 10. If the semiconductor integrated circuit device is a dynamic random access memory device, the polysilicon film is further used for an accumulating electrodes of stacked type storage capacitors, and the etching stopper 17 and the accumulating electrodes are concurrently patterned. If the semiconductor integrated circuit is a Bi-CMOS circuit, the etching stopper 17 is patterned together with emitter electrodes of bipolar transistors.

Silicon dioxide or boro phospho-silicate glass is deposited to thickness of 0.7 micron over the entire surface of the structure through a chemical vapor deposition, and the third insulating film 14a covers the second insulating film 13 and the etching stopper 17.

The second and third insulating films 13 and 14a are selectively etched away for forming the contact holes 15a and 15b, and the contact holes 15a and 15b exposes both end portions 10a and 10b of the breakable fuse element 10. A conductive substance is deposited over the entire surface of the structure, and the conductive film is brought into contact with both end portions 10a and 10b through the contact holes 15a and 15b. The conductive film is patterned into the wirings 16a and 16b by using a lithographic process.

After the formation of the wiring strips 16a and 16b, an insulating substance is deposited over the entire surface of the structure, and the wiring strips 16a and 16b and the third insulating film 14a are overlain by the fourth insulating film 14b serving as the surface passivation film. In this instance, the fourth insulating film 14b is formed of silicon dioxide or phospho-silicate glass. However, the fourth insulating film 14b may be implemented by combination of a phosho-silicate glass film and a silicon nitride film or combination of undoped silicon dioxide film and a silicon nitride film. A single insulating film such as SiON is also available. The third and fourth insulating films 14a and 14b form in combination the multi-level insulating film sub-structure 14.

An appropriate mask (not shown) is patterned on the multi-level insulating film sub-structure 14, and exposes a surface portion over the etching stopper 17. Using the mask layer, the multi-level insulating film sub-structure 14 is selectively etched away, and the hole 18 is formed in the multi-level insulating film sub-structure 14. In this instance, the hole 18 is formed by using a reactive ion etching, and gaseous etchant contains $CHF_3$ gas. The etchant etches a silicon dioxide film ten times faster than a polysilicon film, and the etchant is easily terminated at the etching stopper 17.

The etching stopper 17 is effective against over-etching of the multi-level insulating film structure. For example, assuming now that two inter-level insulating films each 0.8 micron thick are inserted between the third insulating film 14a and the fourth insulating film 14b, the total thickness of the multi-level insulating film sub-structure 14 ranges from (3.3−0.33) microns to (3.3+0.33) microns. If the total thickness is maximized and the etching speed is minimized, the etching for 42 minutes decreases the total thickness to a certain thickness calculated as $\{(3.3+0.33)-(0.08-0.004)\times 42\}=0.44$ micron. On the other hand, if the total thickness is minimized and the etching speed is maximized, the etching for 42 minutes decreases the total thickness to a certain thickness calculated as $\{(3.3-0.33)-(0.08+0.004)\times 42\}=-0.56$ micron. If the second insulating film 13 of 0.44 micron is left on the etching stopper 17, the remaining thickness over the breakable fuse element 10 is 1.04 micron. On the other hand, if the etching stopper 17 is partially etched, the value of over-etching is modified to −0.056 micron, because the etching rate to polysilicon is decreased to a tenth. Therefore, the remaining thickness over the breakable fuse element 17 is 0.55 micron, and the remaining thickness falls into the range from 0.55 micron to 1.04 micron. Thus, the etching stopper 17 allows the remaining thickness to fall into the acceptable range, and the production yield is increased.

Figure 5:
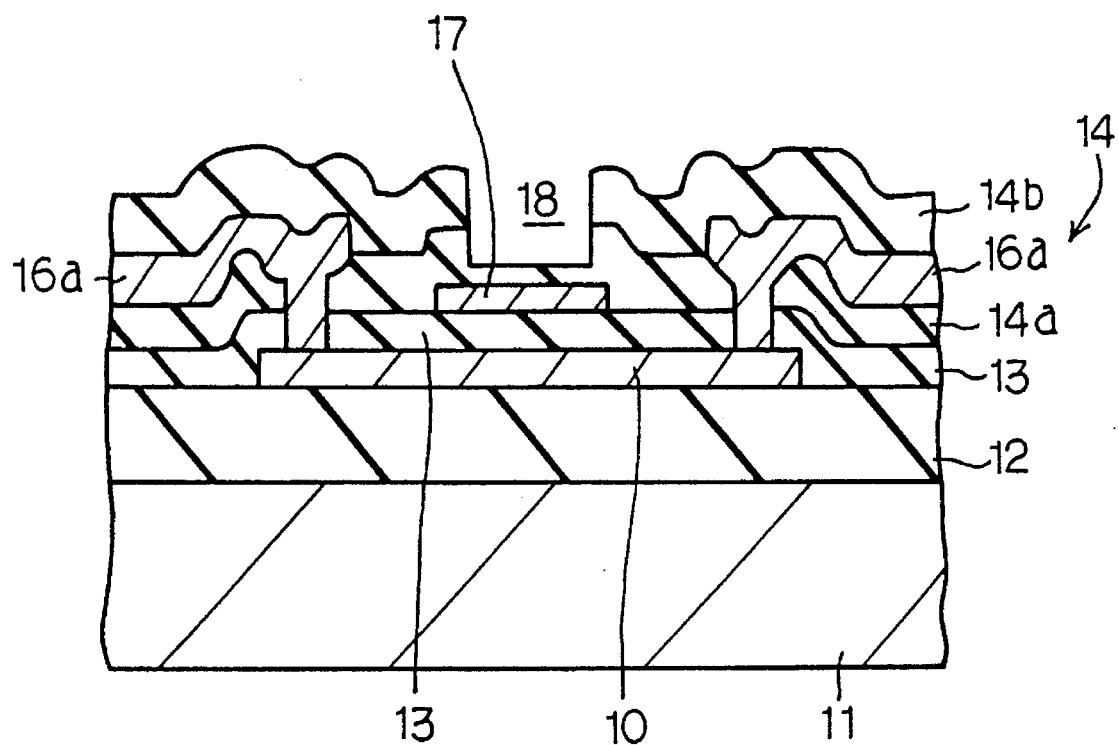
FIG. 5 is a cross sectional view showing the structure of the fuse element in case where an insulating film is left on an etching stopper.

If the third insulating film 14a is partially left on the etching stopper 17, the structure is slightly different from that shown in FIG. 4, and FIG. 5 illustrates the different structure.

A wet etching is available instead of the reactive ion etching, and etchant of the wet etching contains HF. The wet etching is less desirable in view of aspect ratio, because the etchant is isotropical. However, the etching speed to silicon oxide is a thousand times faster than polysilicon, and the remaining thickness over the breakable fuse element 10 can be determined by the second insulating film 13 and the etching stopper 17.

The etching stopper 17 is formed of polysilicon or fabricated from a polysilicon film and a silicon nitride film, and may be removed after the formation of the hole 18.

Although particular embodiments of the present invention have been shown and described, it will be obvious to those skilled in the art that various changes and modifications may be made without departing from the spirit and scope of the present invention. Various combination of etching stopper and etchant are available in the structure of the breakable fuse element.

What is claimed is:

1. A method of programming a breakable fuse element incorporated in a semiconductor device, comprising the steps of:

preparing a semiconductor device including
  a first insulating film over a major surface of said semiconductor substrate,
  a breakable fuse element formed on said first insulating film,
  a multi-level insulating film structure covering said breakable fuse element and having a second insulating film covering said breakable fuse element and a multi-level insulating sub-structure covering said second insulating film,
  wiring strips formed in said multi-level insulating sub-structure, and
  an etching stopper of polysilicon provided between said second insulating film and said multi-level insulating substructure, said etching stopper and said second insulating film being transparent to a laser beam;
 forming a hole in said multi-level insulating sub-structure over said etching stopper through an ion etching using an etchant selective between said polysilicon and a substance of said multi-level insulating sub-structure until said hole exposes a top surface of said etching stopper, the total thickness of said etching stopper and said second insulating film being regulated within a predetermined range allowing said laser beam to effectively break said breakable fuse element; and
 radiating said laser beam through said etching stopper and said second insulating film for breaking said breakable fuse element without current passing through said breakable fuse element or leaving said breakable fuse element without radiation of said laser beam depending upon a logic level of a data bit stored in said breakable fuse element.

2. The method as set forth in claim 1, in which said multi-level insulating sub-structure is formed of silicon oxide, and said etchant is gaseous etchant containing $CHF_3$.

3. The method as set forth in claim 1, in which said multi-level insulating sub-structure is formed of silicon oxide, and said etchant is formed of solution containing HF.

4. A method of programming a breakable fuse element incorporated in a semiconductor device, comprising the steps of:

preparing a semiconductor device including
  a first insulating film over a major surface of said semiconductor substrate,
  a breakable fuse element formed on said first insulating film,
  a multi-level insulating film structure covering said breakable fuse element and having a second insulating film coveting said breakable fuse element and a multi-level insulating sub-structure covering said second insulating,
  wiring strips formed in said multi-level insulating sub-structure and held in contact with both end portions of said breakable fuse element, and
  a etching stopper of polysilicon provided between said second insulating film and said multi-level insulating sub-structure;
 forming a recess in said multi-level insulating sub-structure over said etching stopper through an ion etching using an etchant selective between said polysilicon and a substance of said multi-level insulating sub-structure until said hole exposes a top surface of said etching stopper, the total thickness of a remaining layer of said multi-level insulating sub-structure, said etching stopper and said second insulating film being regulated within a predetermined range allowing a laser beam to pass for effectively breaking said breakable fuse element; and radiating said laser beam through said remaining layer, said etching stopper and said second insulating film for breaking said breakable fuse element without current passing through said breakable fuse element or leaving said breakable fuse element without radiation of said laser beam depending upon a logic level of a dam bit stored in said breakable fuse element.

5. The method as set forth in claim 4, in which said multi-level insulating sub-structure is formed of silicon oxide, and said etchant is gaseous etchant containing $CHF_3$.

6. The method as set forth in claim 4, in which said multi-level insulating sub-structure is formed of silicon oxide, and said etchant is formed of solution containing HF.

* * * * *